United States Patent
Gassilloud et al.

(10) Patent No.: US 9,768,379 B2
(45) Date of Patent: Sep. 19, 2017

(54) NON VOLATILE RESISTIVE MEMORY CELL AND ITS METHOD OF MAKING

(71) Applicant: Commissariat A L'Energie Atomique et aux Energies Alternatives, Paris (FR)

(72) Inventors: Remy Gassilloud, Saint Laurent du Pont (FR); Mathieu Bernard, Saint Martin le Vinoux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/989,300

(22) Filed: Jan. 6, 2016

(65) Prior Publication Data

US 2016/0197271 A1 Jul. 7, 2016

(30) Foreign Application Priority Data

Jan. 6, 2015 (FR) ...................................... 15 50049

(51) Int. Cl.
*H01L 45/00* (2006.01)
*H01L 27/10* (2006.01)

(52) U.S. Cl.
CPC ............ *H01L 45/08* (2013.01); *H01L 27/101* (2013.01); *H01L 45/04* (2013.01); *H01L 45/122* (2013.01);
(Continued)

(58) Field of Classification Search
CPC ......... H01L 45/08; H01L 45/04; H01L 45/12; H01L 45/122; H01L 45/085;
(Continued)

(56) References Cited

U.S. PATENT DOCUMENTS 8,405,076 B2 * 3/2013 Ninomiya ........... H01L 45/1625
257/2
8,772,750 B2 * 7/2014 Lee .................... G11C 13/0007
257/4
(Continued)

FOREIGN PATENT DOCUMENTS

WO WO 2015/147801 A1 10/2015

OTHER PUBLICATIONS

French Preliminary Search Report issued Dec. 14, 2015 in French Application 15 50049, filed on Jan. 6, 2015 (with English Translation of Categories of Cited Documents and Written Opinion).
(Continued)

*Primary Examiner* — Jose R Diaz
(74) *Attorney, Agent, or Firm* — Oblon, McClelland, Maier & Neustadt, L.L.P.

(57) ABSTRACT

A resistive non-volatile memory cell including a Metal-Insulation-Metal stack including two electrodes and a multilayer of insulation, placed between the two electrodes, including a thin layer of oxide allowing for a resistive transition and an oxygen vacancy reservoir layer is provided. The stack includes from bottom to top: the bottom electrode including a metal layer, the insulation including a layer of stoichiometric metal oxide and a layer of substoichiometric metal oxide forming the oxygen vacancy reservoir layer, and the top electrode including a layer of metal oxide and a metal layer, such that the oxygen vacancy reservoir layer is inserted between two metal oxide stoichiometric layers.

28 Claims, 2 Drawing Sheets

(52) U.S. Cl.
CPC ...... *H01L 45/1233* (2013.01); *H01L 45/1253* (2013.01); *H01L 45/146* (2013.01); *H01L 45/165* (2013.01); *H01L 45/1608* (2013.01); *H01L 45/1641* (2013.01)

(58) Field of Classification Search
CPC ............. H01L 45/1233; H01L 45/1266; H01L 45/146; H01L 45/14; H01L 45/16; H01L 45/1608; H01L 45/1641; H01L 45/165
See application file for complete search history.

(56) References Cited

U.S. PATENT DOCUMENTS

| | | | |
|---|---|---|---|
| 8,999,808 B2* | 4/2015 | Fujii | H01L 45/08 257/2 |
| 2010/0110758 A1 | 5/2010 | Li et al. | |
| 2012/0032132 A1 | 2/2012 | Lee et al. | |
| 2013/0146829 A1 | 6/2013 | Kim et al. | |
| 2014/0197368 A1 | 7/2014 | Yoneda et al. | |
| 2014/0264237 A1* | 9/2014 | Chen | H01L 45/146 257/4 |

OTHER PUBLICATIONS

Gyeong-Su Park et al. "In Situ observation of filamentary conducting channels in a asymmetric $Ta_2O_{5-x}/TaO_{2-X}$ bilayer structure", Nature Communications, 2013, 9 pages.

Yuchao Yang et al. "Oxide Heterostructure Resistive Memory", Nano Letters, May 31, 2013, 1 page.

Chung-Wei Hsu et al. "Homogeneous barrier modulation of $TaO_x$/$TiO_2$ bilayers for ultra-high endurance three-dimensional storage-class memory", IOP Science, Nanotechnology, vol. 25, No. 16, 2014, 2 pages.

Sheikh Ziaur Rahaman et al. "Excellent resistive memory characteristics and switching mechanism using a Ti nanolayer at the $Cu/TaO_x$ interface", Nanoscale Research Letters, 2012, 7 pages.

* cited by examiner

NON VOLATILE RESISTIVE MEMORY CELL AND ITS METHOD OF MAKING

TECHNICAL FIELD

This invention in general relates to non-volatile memories with resistive elements. It more particularly describes a resistive non-volatile memory cell and the method of manufacture thereof.

The invention will be used possibly in all applications already covered by existing non-volatile memories; in particular, memories of the Flash type. Due to their access time and their writing facility, non-volatile memories with resistive elements can also replace conventional static memories or SRAM (static random access memory).

The invention will also be used to carry out memory structures of the neuromorphic type or for CBRAM memories for the acronym "Conductive Bridge Random Access Memory" or in nanoelectric devices based on the principle of Metal/Insulation transitions also called "Mott insulator", such as for example Mott selectors, Mott transistors, devices including photo-induced Mott transitions.

PRIOR ART

Memories with resistive elements use a material that can reversibly switch between at least two stable states having different electrical resistances.

Resistive memories are globally designated under the name of RRAM, acronym for "resistive random access memory".

Among the various types of existing resistive memories those of which the base material is a dielectric, normally insulating, are more particularly considered. These memories designated by the term OxRAM use metal oxides (Ox) as a dielectric material of which the resistance can be reversibly controlled.

These memories implement an operating mode wherein at least one conductive filament can be formed between two electrodes separated by the oxide after application of a sufficiently substantial voltage between the latter. Once the filament has been formed, a low resistance state, generally qualified as LRS, is obtained. This state can be reversed by an operation referred to as "RESET", in order to put the memory into a second high resistance state or HRS, operation during which the filament or filaments are broken. Once the filament has been formed a first time an operation referred to as "SET" can again put the memory back into a low resistance state or LRS by reforming at least one filament.

It is known from In situ observation of filamentary conducting channels in an asymmetric Ta2O5-x/TaO2-x bilayer structure Gyeong-Su Park, Nature Communications 4, (2013) 2382, a MIM stack of which the memory layer is comprised of a metal oxide with a Tantale base, as a single layer or as a TaOx/Ta2O5 bilayer. The TaOx film, stoichiometric in oxygen and vacancy reservoir, provides the vacancies required to form the conductive filament in the Ta2O5 making it possible to modulate the resistance of the latter.

These resistive non-volatile memory structures have an oxygen vacancy reservoir located in contact with the electrodes. This imposes using electrodes that are not sensitive to oxygen/vacancy movements in particular by electrodes made of noble materials. However, using electrodes of a noble nature substantially limits the use of such a stack in a standard integration of microelectronics wherein only a certain number of metals, which do not include noble metals, have shown their immunities with respect to the operation of a transistor.

Moreover, it has been shown that the use of a non-noble electrode often results in an increase in the variability from one device to the other as well as a low reliability of the memory cell in terms of cycling and retention as a function of time.

This invention has for purpose to respond to at least some of these problems.

SUMMARY OF THE INVENTION

This invention proposes for this purpose a resistive non-volatile memory cell comprising a stack of the Metal-Insulation-Metal type with a bottom electrode and a top electrode and wherein the insulation is a multilayer comprising a layer of stoichiometric metal oxide and a layer of substoichiometric metal oxide forming an oxygen vacancy reservoir layer and wherein the metal layer forming the top electrode comprises a layer of stoichiometric metal oxide below said metal layer. This arrangement makes it possible to place the oxygen vacancy reservoir layer between two layers of stoichiometric metal oxide suppressing the contact between said vacancy reservoir layer and the electrodes. In this way the quantity of oxygen vacancies in the reservoir is stable over the time and the cycling of the memory. Advantageously, the selection of the materials for the electrodes extends beyond noble metals which allows for an integration of the memory cell according to the invention to the standard of microelectronics in a transistor.

Moreover, in the framework of the development of this invention, it has been shown that a contact between an oxygen vacancy reservoir and a non-noble electrode can induce a variation in the quantity of oxygen in the reservoir of oxygen vacancies as a function of time or in the course of cycling of the memory cell that can result in an increase in the variability from one device to the other.

The invention makes it possible as such to respond to this problem. It also makes it possible to improve the reliability of the memory cells in terms of cycling and retention as a function of time.

Advantageously, the electrodes are non-noble metals.

Advantageously, the metals M1 of the bottom electrode, M2 of the multilayer insulation and M3 of the layer of stoichiometric metal oxide are chosen in such a way that the metal M3 reduces the stoichiometric metal oxide I2 of the insulation but not a stoichiometric metal oxide I1 potentially present on the surface of the metal layer forming the bottom electrode.

Advantageously, the free formation enthalpy DG3 of the stoichiometric metal oxide I3 by oxidation of a metal M3 is greater in absolute value than the free formation enthalpy DG2 of the stoichiometric metal oxide I2 by oxidation of a metal M2.

Advantageously, the free formation enthalpy DG1 of the stoichiometric metal oxide I1 by oxidation of a metal M1 is greater than or equal in absolute value to the free formation enthalpy DG3 of the stoichiometric metal oxide I3 by oxidation of a metal M3.

According to another aspect, the invention relates to a method for manufacturing a memory cell as claimed in any preceding claim comprising the following successive steps of depositing a metal layer M1 in order to form the bottom electrode, of depositing a metal oxide layer I2, of depositing a metal layer M3, of reacting the metal layer M3 with the stoichiometric metal oxide I2 forming a substoichiometric oxide I2p and a metal oxide I3, of depositing a metal layer M4.

According to another aspect, the invention relates to a microelectronic device characterized in that it comprises a memory cell such as described hereinabove.

Advantageously, the device comprises a cavity wherein the memory cell is at least partially arranged. According to an embodiment the memory cell is entirely comprised in the cavity.

This arrangement makes it possible through the confinement effect to overcome the impact of the exogenous oxygen brought by the successive steps during the manufacturing of such a device and in particular during the deposit of interconnection oxide. This makes it possible to consider locating the filament in a region that is well defined and preferentially centered of the stack which results in a reduction in the potential of the forming of the filament Vf by constriction of the current lines passing through the stack. This integration also allows for a reduction in the variability of the on state of the device.

According to another aspect, the invention relates to a method of manufacturing a device such as described hereinabove comprising the following successive steps:
Compliant depositing of a layer of stoichiometric metal oxide I2 in the cavity;
Depositing of a metal layer M3 in the cavity;
Reaction of the metal layer M3 with the stoichiometric metal oxide I2 forming a substoichiometric oxide I2p and a stoichiometric metal oxide I3;
Depositing of at least one metal layer M4 in the cavity.

BRIEF DESCRIPTION OF THE FIGURES

The purposes and objects as well as the characteristics and advantages of the invention shall appear better from the detailed description of an embodiment of the latter which is shown in the accompanying figures wherein:

FIGS. 3 to 9: show a memory cell according to the invention arranged at least partially in a cavity of a microelectronic device.

The attached drawings are provided as examples and do not limit the invention. They constitute block diagram representations intended to facilitate the understanding of the invention and are not necessarily to the scale of practical applications. In particular the relative thicknesses of the various layers and films are not representative of reality.

DETAILED DESCRIPTION OF THE INVENTION

Before beginning a detailed review of embodiments of the invention, are mentioned hereinafter optional characteristics that can possibly be used in association or alternatively.

First recall that the invention relates to a resistive non-volatile memory cell comprising a stack comprising two electrodes and a multilayer of insulation, placed between said two electrodes, comprising a layer of oxide that allows for a resistive transition and an oxygen vacancy reservoir layer characterized in that the stack comprises from bottom to top:
a bottom electrode comprising a metal layer M1,
an insulation comprising a layer of stoichiometric metal oxide I2 and a layer of substoichiometric metal oxide I2p forming said oxygen vacancy reservoir layer
a top electrode comprising a layer of stoichiometric metal oxide I3 and a metal layer M4, in such a way that the oxygen vacancy reservoir layer is inserted between two layers of stoichiometric metal oxides I2 and I3.

Advantageously, metals M2 and M3 respectively for forming the insulation I2 and I2p and for forming the layer of stoichiometric metal oxide I3 are chosen in such a way that the free formation enthalpy DG3 of the stoichiometric metal oxide I3 by oxidation of the metal M3 is greater in absolute value than the free formation enthalpy DG2 of the stoichiometric metal oxide I2 by oxidation of the metal M2.

Advantageously, the bottom electrode comprises above the metal layer M1, a layer I1 of metal oxide of M1.

Advantageously, the metals M1 and M3 are chosen in such a way that the free formation enthalpy DG1 of the oxide I1 by oxidation of a metal M1 is greater than or equal in absolute value to the free formation enthalpy DG3 of the oxide I3 by oxidation of a metal M3.

Advantageously, the metal M1 is chosen in such a way that the free formation enthalpy DG1 of the oxide I1 by oxidation of a metal M1 is greater than or equal in absolute value to the free formation enthalpy DG of the reaction $2Cu+O_2 \rightarrow 2CuO$.

Advantageously, the metals M1 and M4 are chosen from a non-noble metal other than Pd, Ag, Ir, Pt, Au, or a pure metal or a binary or ternary metal alloy, or an alloy with a nitride or carbide or silicide base or conductive metal oxide.

Advantageously, the metals M1 and M4 are chosen from TiN, TaN, TiAlN, TaAlN.

Advantageously, the bottom electrode and the top electrode are symmetrical in the stack.

Advantageously, the layer I1 of stoichiometric metal oxide of M1 is chosen from $TiO_2$ or TiON or $Al_2O_3$.

Advantageously, the layer of stoichiometric oxide I2 is formed using a metal M2 chosen from columns III, IV, V, of the periodic table, or Al or Si, or lanthanides.

Advantageously, the layer of stoichiometric oxide I2 is chosen from $HfO_2$, $ZrO_2$, $TiO_2$, $Al_2O_3$, $Ta_2O_5$, $Nb_2O_5$, $V_2O_5$, $La_2O_4$, $Gd_2O_3$, $Lu_2O_3$, HfSiO, HfZrO, STO.

Advantageously, the layer of stoichiometric oxide I2 of a metal M2 has a thickness from 1 to 50 nm.

Advantageously, the layer of metal oxide I3 is formed using a metal M3 chosen from, a pure metal or a binary or ternary metal alloy.

Advantageously, the metal M3 is chosen from Si, Ti, Zr, Hf, Al, Ta, Nb, V, and alloys as a mixture of these elements, for example TiAl, TaAl.

Advantageously, the stack comprises from bottom to top: TiN/TiO2/Ta2O5/TaOx/TiO2/TiN, or TiN/TiO2/Ta2O5/TaOx/Nb2O5/TiN, or TiN/TiO2/V2O5/VOx/Nb2O5/TiN, or TiN/TiO2/V2O5/VOx/Ta2O5/TiN Another object of the invention is a method for manufacturing a memory cell such as described hereinabove comprising the following successive steps:

Depositing of a metal layer M1 in order to form the bottom electrode,
Depositing of a layer of stoichiometric metal oxide I2,
Depositing of a metal layer M3,
Reaction of the metal layer M3 with the metal oxide I2 forming a substoichiometric oxide I2p and a stoichiometric metal oxide I3,
Depositing of a metal layer M4.

Advantageously, the depositing of the metal layer M3 is carried out by flash vapor phase deposition. Advantageously, the depositing of the metal layer M3 is not a compliant deposition. This makes it possible in particular to simplify the carrying out.

Advantageously, the metal layer M3 is deposited on a thickness from 0.1 to 2 nm.

Advantageously, the layer of stoichiometric metal oxide I2 is deposited by chemical deposition.

Advantageously, the layer of stoichiometric metal oxide I2 is treated with plasma or by plasma nitriding.

Advantageously, the layer of stoichiometric metal oxide I2 is implanted with aluminum.

Another object of the invention is a microelectronic device characterized in that it comprises a memory cell such as described hereinabove.

Advantageously, the device comprises a cavity wherein the memory cell is at least partially arranged. The cavity is formed in an electrically insulated material, such as an oxide.

Advantageously, the bottom electrode of the memory cell is arranged underneath and outside of the cavity.

Advantageously, the bottom electrode of the memory cell is arranged in the cavity.

Advantageously, the device comprises a plurality of interconnection levels and a plurality of connection plugs between the levels, each plug comprising a cavity wherein a memory cell is at least partially arranged such as described hereinabove.

Another object of the invention is a method for manufacturing a device such as described hereinabove comprising the following successive steps:

Compliant depositing of a layer of stoichiometric metal oxide I2 in the cavity,
Depositing of a metal layer M3 in the cavity, more preferably by flash vapor phase deposition. This depositing of the metal layer M3 is carried out on the layer of stoichiometric metal oxide I2, more preferably in the bottom of the cavity in such a way that a portion of the wall or walls of the layer of stoichiometric metal oxide I2 is not covered by the metal layer M3;
Reaction of the metal layer M3 with the stoichiometric metal oxide I2 forming a substoichiometric oxide I2p and a stoichiometric metal oxide I3,
Depositing of at least one metal layer M4 in the cavity. This depositing of the metal layer M4 is carried out on the stoichiometric metal oxide I3 and on the vertical wall or walls of the layer of stoichiometric metal oxide I2.

Advantageously, the method comprises the compliant depositing of a metal layer M1 in the cavity in order to form the bottom electrode before the depositing of the layer of stoichiometric metal oxide I2.

Advantageously, the method comprises the depositing of a metal layer M5 in order to fill in the cavity.

Advantageously, the depositing of the metal layer M3 is carried out by flash vapor phase deposition.

Advantageously, the metal layer M3 is deposited on a thickness from 0.1 to 2 nm.

Advantageously, the layer of stoichiometric metal oxide I2 is deposited by chemical deposition.

Advantageously, the layer of stoichiometric metal oxide I2 is treated with plasma or by plasma nitriding.

Advantageously, the layer of stoichiometric metal oxide I2 is implanted with aluminum.

Note that the relative characteristics mentioned hereinabove, in particular those pertaining to the stack of the memory cell and to the arrangement of the memory cell in the cavity, although working in synergy when they are combined, can be used independently of one another and nevertheless confer certain technical advantages.

It is specified that in the framework of this invention, the term "on", "overmounts" or "underlying" or the equivalent does not necessarily means "in contact with". As such for example, the depositing of a first layer onto a second layer, does not necessarily mean that the two layers are directly in contact with one another but this means that the first layer covers at least partially the second layer by being either directly in contact with it or by being separated from it by another layer or another element.

The terms "layer" and "film" are here considered to be synonyms.

The term "thin layer" means a layer of which the thickness varies from a few atomic layers to a few micrometers.

The term microelectronic device means any type of device carried out by means of microelectronics. These devices encompass in particular in addition to devices with a purely electronic purpose, micromechanical or electromechanical devices (MEMS, NEMS . . . ) as well as optical or optoelectronic devices (MOEMS . . . )

The memory cell according to the invention is a stack of layers of the Metal-Insulation-Metal (MIM) type more specifically of the Metal-Oxide-Metal (MOM) type. The memory cell is a resistance change non-volatile memory. Resistive memories (RRAM for Resistive Random Access Memory) are based on the change in resistance of an active material, more precisely in the subcategory of OxRRAM (Oxide RRAM) the active material is an oxide forming insulation 2. The two metal layers on either side of the insulation 2 are electrodes 1, 3.

Figure 1:
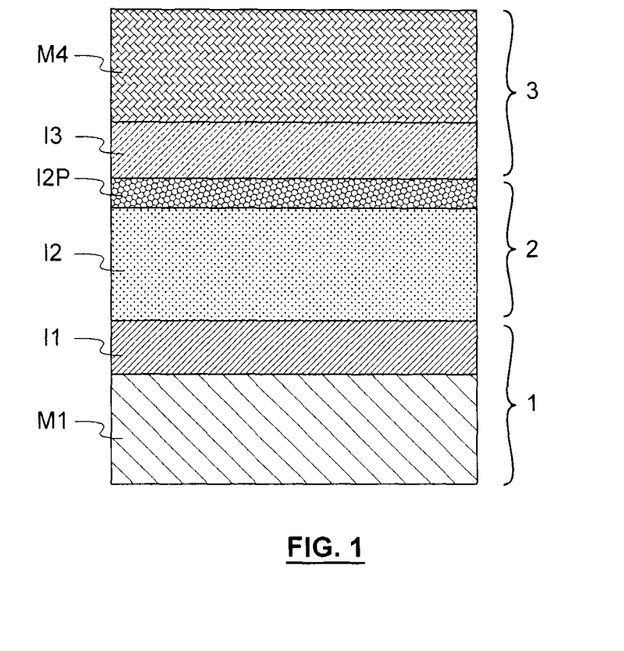
FIG. 1: Diagram of a memory cell according to the invention.

The stack according to a preferred embodiment of the invention is shown in FIG. 1. The stack comprises from bottom to top: a metal layer M1, possibly a layer of metal oxide I1, a layer of stoichiometric metal oxide I2, a layer of substoichiometric metal oxide I2p, a layer of stoichiometric metal oxide I3 and a metal layer M4.

A bottom electrode 1 comprises the metal layer M1 and on top potentially a layer of metal oxide I1.

The metal layer M1 is formed by a non-noble metal. The term noble here means a metal that does not oxidize spontaneously in air. According to the invention, noble metals mean silver (Ag), Iridium (Ir), Platinum (Pt), gold (Au) and palladium (Pd). The metal layer M1 can be a pure metal or a binary or ternary metal alloy such as for example TiAl, TaAl, TiAlN, TaAlN or an alloy with a nitride or carbide or silicide base or conductive metal oxide, preferentially TiN, TaN.

The metal oxide I1 is an oxide that can form during the method of manufacturing the memory cell. The metal of the metal layer M1 can be oxidized by the air in contact, or by a stoichiometric metal oxide I2 described hereinafter. According to another possibility, the metal layer M1 can also be intentionally oxidized in order to form the metal oxide I1. According to yet another possibility, the metal oxide I1 is deposited, for example in order to form a non-linear resistance diode or selector. By way of example the metal oxide I1 is TiO2 or TiON.

An insulation 2 advantageously comprises at least two layers of materials also referred to as a multilayer, the insulation 2 is preferentially a bilayer. The bilayer comprises a layer of stoichiometric metal oxide I2 and a layer of substoichiometric metal oxide I2$p$.

The term stoichiometric means the proportion of the elements in an empirical formula. A substoichiometric layer according to the invention has a proportion of oxygen less than the stoichiometric proportion of the compound.

The stoichiometric metal oxide I2 constitutes the active layer having a resistive variation according to a voltage applied. The substoichiometric metal oxide I2$p$ constitutes a reservoir layer of oxygen vacancies. This layer is an oxide having a quantity of oxygen less than the stoichiometric oxide. This lack of oxygen is defined as oxygen vacancies. The more oxygen vacancies a material has, the more conductive it is. This layer I2$p$ of a reserve of oxygen vacancies makes it possible to facilitate the variations in resistivity of the oxide layer I2. Indeed, the two layers I2 and I2$p$ interact during the SET and RESET phases in such a way as to allow for the formation of conductive filaments between the two electrodes 1 and 3.

The layer of stoichiometric metal oxide I2 is advantageously a thin layer.

The stoichiometric metal oxide I2 is a metal stoichiometric oxide. This oxide I2 is chosen from columns III, IV, V, of the periodic table, or Aluminum (Al) or Silicon (Si), or a lanthanide, by way of example HfO2, ZrO2, TiO2, Al2O3, Ta2O5, Nb2O5, La2O4, Gd2O3, Lu2O3, or ternary compounds HfSiO, HfZrO, STO. The stoichiometric metal oxide I2 is preferentially Ta2O5. Preferentially, the layer of stoichiometric metal oxide I2 is deposited by chemical deposition. Advantageously its thickness is between 1 nm and 50 nm. According to a possibility, the stoichiometric metal oxide I2 is treated with plasma. This type of treatment makes it possible to modulate the final thickness L and/or the oxygen depletion profile of the layer of substoichiometric metal oxide I2$p$. By way of example, treatments of the plasma nitriding type (Radio-frequency or Microwave N2 plasma) with nitrogen or nitriding under a reducing atmosphere typically in a hydrogen atmosphere N2+H2.

According to another possibility, the layer of stoichiometric metal oxide I2 is treated by implantation. The implantation can be carried out directly in the layer I2 or through the layer of stoichiometric metal oxide I3 and the layer of substoichiometric metal oxide I2$p$. This treatment by implantation makes it possible to favor the formation of conductive filaments between the bottom electrode 1 and the top electrode 3 of the stack of the memory cell. By way of example, an implantation of aluminum can be carried out.

The metal oxide I2$p$ is a substoichiometric oxide. This oxide I2$p$ is not voluntarily deposited but comes from a reaction with a metal M3 deposited above the stoichiometric metal oxide I2.

The metal M3 is preferentially a pure metal or a binary or ternary metal alloy, for example, TiAl, TaAl, preferentially pure Titanium (Ti).

According to a preferred embodiment, the metal M3 is deposited par flash vapor phase deposition (flash PVD). The term "flash" corresponds to control over a very short period of time, advantageously of a magnitude of a second, of the depositing of a film of a few Angstroms. Preferentially, the metal layer M3 deposited is of a thickness from 0.1 nm to 2 nm. Controlling this time makes it very advantageously possible to very precisely deposit the quantity of metal M3 desired in order to be able to module the oxygen depletion depth in the layer of stoichiometric metal oxide I2 and the final thickness L of the layer of substoichiometric metal oxide I2$p$.

The flash time makes it possible to define the final thickness of the stoichiometric metal oxide I3. The type of deposit of the metal M3 influences the overall resistivity of the memory cell. According to an embodiment, the flash deposit makes it possible to form localized islands, also called dots, nanodots or nanocrystals, making it possible to locally reduce the layer of stoichiometric metal oxide I2, and as such enable the locating of the conductive filaments 4 in the layer of stoichiometric metal oxide I2.

The metal M3 deposited is no longer present in the form of metal in the finalized memory cell. The metal M3 is configured to react with the layer of stoichiometric metal oxide I2. This reaction leads to a partial reduction of the stoichiometric metal oxide I2 as a substoichiometric metal oxide I2$p$ and the oxidation of the metal M3 as a layer of stoichiometric metal oxide I3. As a preferred example, the metal M3 is pure titanium that reacts with the stoichiometric metal oxide I2, Ta2O5, in order to form the stoichiometric metal oxide I3, TiO2, and the substoichiometric metal oxide I2$p$, TaO2. This reaction can according to a possibility be activated thermally.

Advantageously, the reduction of the oxide I2 by the metal M3 is possible if the free formation enthalpy (DG3) of the reaction M3+O2->I3 is greater in absolute value than the free formation enthalpy (DG2) of the reaction M2+O2->I2. This can be summarized by |DG3|>|DG2|. An Elligham diagram can typically be used in order to provide the direction of the reactions.

The quantity of metal M3 deposited is very low with respect to the thickness of I2 in such a way as to not consume all of the stoichiometric metal oxide I2 without being able to obtain the oxygen depletion profile aimed for in the substoichiometric metal oxide I2$p$.

According to an embodiment the metal M3 reduces the layer of stoichiometric metal oxide I2, but not a layer of oxide I1 possibly present on the surface of the metal layer M1. Because of this it is advantageous that the free formation enthalpy (DG1) of the reaction M1+O2->I1 be greater than or equal in absolute value to the free formation enthalpy (DG3) of the reaction M3+O2->I3 i.e. |DG1|≥|DG3| or |DG1≤DG(2Cu+O2->2CuO)| i.e. the free formation enthalpy DG1 of the oxide I1 by oxidation of a metal M1 is greater than or equal in absolute value to the free formation enthalpy DG of the reaction 2Cu+O2->2CuO.

A top electrode 3 comprises the metal layer M4 and a layer of stoichiometric metal oxide I3. The layer of metal oxide I3 forms an insulation layer that makes it possible to insulate the metal layer M4 forming partially the top electrode 3 of the layer of substoichiometric metal oxide I2$p$ constituting the oxygen vacancy reservoir layer. The presence of this insulating layer I3 makes it possible to avoid noble electrodes that risk not being oxidized.

The metal layer M4 is formed by a non-noble metal. The term noble here means a metal that does not oxidize spontaneously in air. According to the invention, noble metals mean silver (Ag), Iridium (Ir), Platinum (Pt), gold (Au) and palladium (Pd). The metal layer M4 can be a pure metal or a binary or ternary metal alloy such as for example TiN, TaN, TiAlN, TaAlN or an alloy with a nitride or carbide or silicide base or conductive metal oxide, preferentially TiN, TaN.

According to a preferred embodiment, the bottom electrode 1 and the top electrode 3 are symmetrical. The term symmetrical here means that the two electrodes 1 and 3 are of the same thickness, of the same properties, of the same materials.

Figure 2:
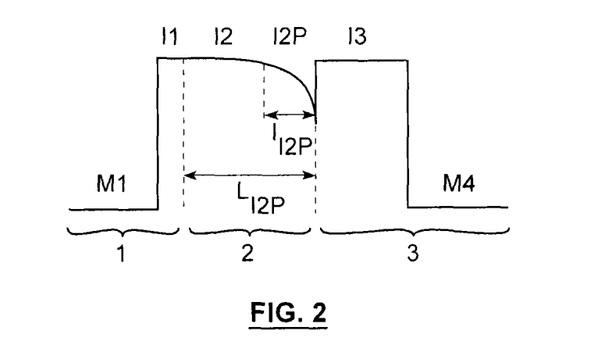
FIG. 2: Curve showing the oxygen profile in each one of the layers of the stack of a memory cell according to the invention.
Figure 3:
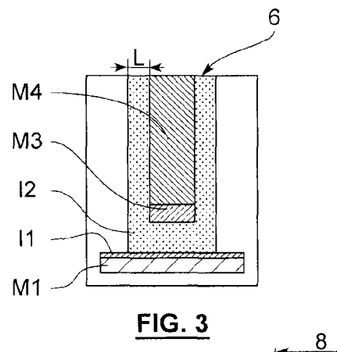
FIG. 3: shows the memory cell according to a first embodiment partially arranged in the cavity before the reaction of the metal layer M3 on the layer of stoichiometric metal oxide I2.
Figure 4:
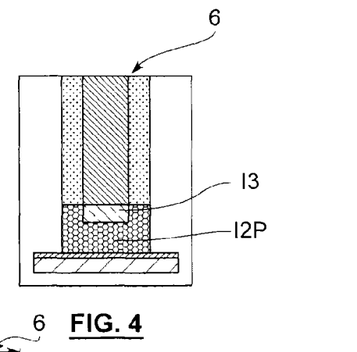
FIG. 4: shows the memory cell of FIG. 3, the metal layer M3 having reacted on the layer of stoichiometric metal oxide I2 in order to form the layer of stoichiometric metal oxide I3 and the layer of substoichiometric metal oxide I2p.
Figure 5:
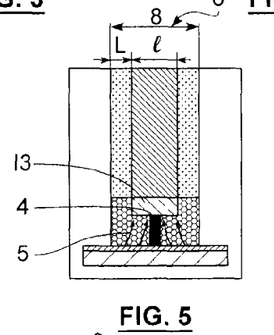
FIG. 5: shows the memory cell of FIG. 4 during the formation of the filament and of the current lines.
Figure 6:
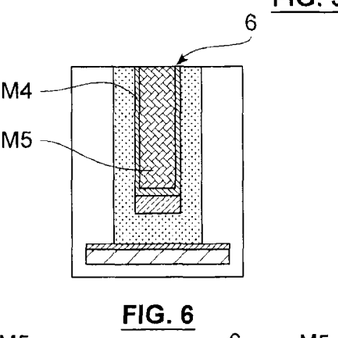
FIGS. 6 and 7: show the memory cell partially arranged in a cavity according to a second embodiment before and after reaction of the metal layer M3 on the layer of stoichiometric metal oxide I2.
Figure 7:
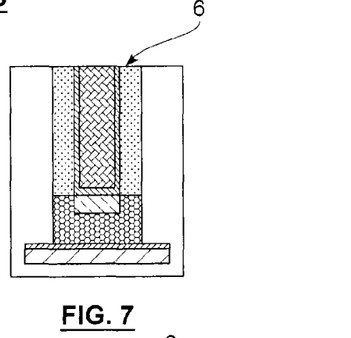

According to a preferred example, the stack of the memory cell is comprised of TiN/TiO2/Ta2O5/TaOx/TiO2/TiN, or TiN/TiO2/Ta2O5/TaOx/Nb2O5/TiN, or Ti N/TiO2/V2O5/VOx/Nb2O5/TiN, or Ti N/TiO2/V2O5/VOx/Ta2O5/TiN According to the invention, an oxygen profile such as shown in FIG. 2 is particularly sought. It can be seen in this figure that the layer of substoichiometric metal oxide I2$p$ has an oxygen depletion in relation to the other layers of stoichiometric metal oxide I1, I2 and I3 of the stack. $L_{I2P}$ denotes the thickness of the stoichiometric metal oxide I2, and small $I_{I2P}$ the thickness of the depletion profile. The depletion profile is characterized by $I_{I2P} < L_{I2P}$.

This invention also relates to a method of manufacturing a memory cell such as described hereinabove.

Such a method comprises a series of successive steps of which the depositing of the metal layer M1, then the depositing of the stoichiometric metal oxide I2 then the depositing of a layer of metal M3 then the forming of the layer of stoichiometric metal oxide I3 and of the substoichiometric metal layer I2$p$ by reaction between the metal M3 and the stoichiometric oxide I2, then the depositing of a metal layer M4.

The reaction between the metal layer M3 and the stoichiometric metal oxide I2 is advantageously controlled by the choice of metals M1, M2 and M3. Advantageously, the free formation enthalpy (DG3) of the reaction M3+O2->I3 is greater in absolute value than the free formation enthalpy (DG2) of the reaction M2+O2->I2. It is advantageous that the free formation enthalpy (DG1) of the reaction M1+O2->I1 is greater than or equal in absolute value to the free formation enthalpy (DG3) of the reaction M3+O2->I3.

Advantageously, the metal layer M3 reduces the layer of stoichiometric metal oxide I2, but not a stoichiometric oxide layer I1 possibly present on the surface of the metal layer M1.

A memory cell according to the invention can be integrated into various microelectronic devices ranging from portable data storage devices to neuromorphic memory structures.

The integration of the active films of a memory cell according to the invention such as described hereinabove, is currently carried out in the Back-End lines of microelectronic devices using memory cells, at a metal level Mi, with the index i being an integer that represents the number of interconnection levels in a device. These films are deposited in planar on the surface of a plug. Then, a step of etching makes it possible to define the final size of the memory cell. Finally, a new plug is created at the upper stage (Mi+1) and connects the top electrode of the memory cell. The formation of a plus requires, the depositing of an oxide at low temperature, the etching of a hole aligned on the top electrode, then the depositing in this hole of a contact metal, typically TiN/W or Ta/TaN/Cu.

The depositing of the low-temperature oxide brings exogenous oxygen in contact with the memory cell and generates a deterioration in the properties of the cell. It is known in document US2014/0197368 the possibility to limit the impact of the exogenous oxygen brought by the step of depositing low-temperature oxygen, by depositing a compliant film of SiN via CVD after the etching of the memory element deposited in planar. This film makes it possible to "seal" the flanks of the memory cell. This type of capping with oxygen with SiN is highly used for CMOS transistors. However, with the reduction in size of devices, this film of SiN also undergoes a reduction in thickness in order to follow the overall geometry of the devices. For example in the lines of the levels Mi, the thickness of the level represents about 2 to 3 times the width of the plug. This is in order to respect a reasonable aspect ratio for the plugs in order to ensure optimum filling of the plugs in chemical CVD. The minimum thickness of the film of SiN proposed in this document is 20 nm. In the case where the memory element has a size of the magnitude or less than 40 nm, it is observed that a film of 20 nm represents about ⅓ of the height if the level Mi. However, below a certain thickness of SiN of about 20 nm, the plasma depositing method of SiO2 impacts the underlying films. Indeed, the treatment plasma used in-situ during the depositing of the inter-plug insulation is physically penetrating and species of the O* type can pass through the SiN protective film.

Therefore, there is a need to propose a technology that makes it possible to limit the impact of the exogenous oxygen brought by the step of depositing low-temperature oxide during the formation of a plug.

According to another aspect of the invention, the memory cell such as described hereinabove can be arranged at least partially in a cavity 6 also referred to as "via".

Advantageously, the invention can also be used for microelectronic and nanoelectronic devices comprising a plurality of interconnection levels and a plurality of connection plugs between the levels. Each plug comprises a cavity 6. According to the invention, the cavity 6 has an opening width 8 less than 180 nm, preferentially less than or equal to 65 nm.

The cavity 6 is formed in the oxide of SiO2 deposited by chemical deposition in order to form an interconnection plus opening onto a connection line 7 of the lower level Mi−1. More generally the cavity 6 is formed in an electrically insulated material.

According to a first embodiment shown in FIGS. 3 to 7, the stack of the memory cell is partially arranged in the cavity 6. The connection line 7 of the lower level Mi−1 forms the metal layer M1 and possibly its layer of stoichiometric metal oxide I1. This is possible when the connection line 7 is made of Al, Ta, TaN or TiN. The layer of stoichiometric metal oxide I1 is then made of Al2O3, TiO2, TiON, Ta2O5, TaON. The metal layer M1 of the bottom electrode 1 and possibly the layer of stoichiometric metal oxide I1 are arranged outside of and under the cavity. The term under means that the metal layer M1 is present before the formation of the cavity, and the term outside of means that the metal layer M1 is of a length greater than the width of the cavity 6. The cavity 6 comprises from bottom to top, the insulation 2 comprising the layer of stoichiometric metal oxide I2 and the layer of substoichiometric metal oxide I2$p$ forming said oxygen vacancy reservoir layer then the layer of stoichiometric metal oxide I3 and the metal layer M4.

According to this stack, the layer of stoichiometric metal oxide I1 is advantageously present in order to maintain the layer of substoichiometric metal oxide I2$p$ in contact with the layers of stoichiometric metal oxide I1, I2 and I3.

Figure 8:
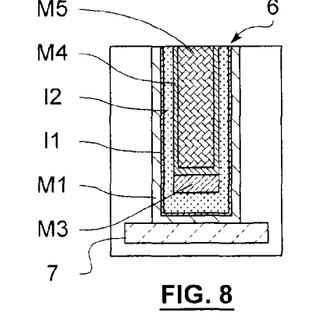
FIGS. 8 and 9: show the memory cell according to a third embodiment wherein the memory element is entirely arranged in a cavity of a microelectronic device.
Figure 9:
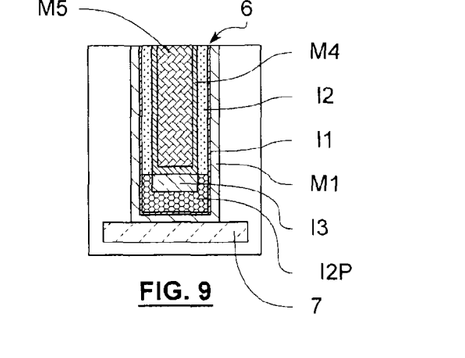

According to a second embodiment shown in FIGS. 8 and 9, the stack of the memory cell is entirely arranged in the cavity 6. The connection line 7 of the lower level Mi−1 does not form the metal layer M1. This is the case in particular when the connection line 7 is made of a material not adapted to the properties required in order to form a bottom electrode 1. The metal layer M1 of the bottom electrode 1 and possibly the layer of stoichiometric metal oxide I1 are arranged in the cavity 6. In this embodiment, note that the insulation 2 formed at least by the compliant layer of stoichiometric metal oxide I2 guarantees the electrical insulation between the metal layers M1 and M4. The metal layer M1 then plays the role of a barrier intended to limit the diffusion of the material of the connection line 7 in the memory cell.

The method of manufacturing a memory cell comprises the steps described hereinafter. The formation of a cavity 6 opening onto a connection line 7 of lower level Mi−1. Possibly, the compliant depositing of a metal layer M1 in the cavity 6. Possibly, the compliant depositing or the formation of a layer of stoichiometric metal oxide I1 in contact with the metal layer M1. The compliant depositing of a layer of stoichiometric metal oxide I2. Advantageously, the depositing of the layer of stoichiometric metal oxide I2 is carried out by vapor phase chemical deposition (acronym CVD). The terms compliant depositing here means that the depositing is carried out at the bottom and on the walls of the cavity 6. The depositing of a layer of metal M3 at the bottom of the cavity, preferentially deposited by vapor phase physical flash depositing (acronym PVD), for example as flash Ti, Al, Zr, Hf, Si, Ta, Nb, V. The method comprises a step of filling in the cavity 6. At least one metal layer M4 is deposited in the cavity 6. The metal layer M4 is advantageously impermeable to, oxygen such as for example Co, Ni, Cu. The deposits of metal layers M1 and M4 are advantageously carried out as for the stack shown in FIG. 1.

The reaction of the metal layer M3 on the stoichiometric metal oxide I2 results in the formation of the substoichiometric oxide I2p located around, more precisely in the immediate vicinity, of the layer of stoichiometric metal oxide I3. This reaction can be assisted by annealing typically aligned on the annealing of the Back End at about 400° C. In this embodiment, the exogenous oxygen sensitive layer I2p is buried at the bottom of the cavity 6, protected from oxidation by insulation layers: the residual stoichiometric metal oxide I2 (i.e. not having reacted) and the stoichiometric metal oxide I3 and the metal layer M4.

According to the invention, the method comprises a step of de-contacting plugs of the same level comprising a chemical-mechanical polishing (acronym CMP). During the depositing of the stoichiometric metal oxide I2 and metal M4 layers, material potentially remains outside of the cavity 6. This material can result in a conduction between the various cavities 6 of the level in the device.

Advantageously, the layer of stoichiometric metal oxide I2 has a width L between 2 and 20 nm. This width L extends as the dimension separating the walls of the cavity 6 from the layer of stoichiometric metal oxide I3.

Advantageously, the layer of stoichiometric metal oxide I3 has a width l between 10 and 40 nm, preferentially 25 nm.

For example, for a cavity of 45 nm, width L of the layer of stoichiometric metal oxide I2 is 10 nm and width l of the layer of stoichiometric metal oxide I3 is 25 nm.

This stack arrangement makes it possible to confine/locate the filament of vacancies under the layer of stoichiometric metal oxide I3 of width l. In addition, the current lines are located in a limited zone increasing overall heating. This constriction of the current lines makes it possible to reduce the formation potential of the filament Vf. The formation potential Vf is advantageously less than 3V and preferentially of a magnitude of 2V as such authorizing the integration of the memory cell according to the invention into CMOS devices. The invention also has the advantage of reducing the variability of the on state, Ron, of the memory cell.

According to another possibility, the filling in of the cavity can be carried out by the stacking of several layers. Such as shown in FIGS. 6 to 9, two metal layers M4 and M5 are deposited in the cavity 6 in order to fill it i. The metal layer M4 can be TiN or TaN. The metal layer M5 is a metal impermeable to oxygen such as Cobalt, Nickel or Copper. In this arrangement, the method of manufacturing comprises a step of disconnecting the metal layers M1 and M5, advantageously by CMP.

This stack of the memory cell at least partially in a cavity can apply to the field of CBRam memories wherein the modulation of the resistance of the insulation 2 is carried out by a filament for example of Copper in the case where the metal layer M4 is Copper. This type of memory can be used to carry out memory structures of the neuromorphic type.

REFERENCES

1. Bottom electrode
2. Insulation
3. Top electrode
4. Filament
5. Current lines
6. Cavity
7. Connection line
8. Opening width of the cavity
M1. Metal layer
I1. Metal oxide layer
I2. Stoichiometric metal oxide layer
I2p. Substoichiometric metal oxide layer
I3. Stoichiometric metal oxide layer
M4. Metal oxide layer
$L_{I2P}$. Finale thickness of the substoichiometric oxide layer I2p
$I_{I2P}$. Thickness of the depletion profile
l. Width of the layer of stoichiometric metal oxide I3
L. Width of the layer of stoichiometric metal oxide I2

The invention claimed is:

1. A resistive non-volatile memory cell comprising a stack, the stack comprising:
a bottom electrode comprising a layer of a first metal (M1);
a multilayer insulation disposed on the bottom electrode, the multilayer insulation comprising:
an oxide layer including a second layer of stoichiometric metal oxide (I2) and being configured to allow a resistive transition, the second layer of stoichiometric metal oxide (I2) comprising a second metal (M2), and
an oxygen vacancy reservoir layer including a layer of sub stoichiometric metal oxide (I2p); and
a top electrode disposed on the multilayer insulation, the top electrode comprising a third layer of stoichiometric metal oxide (I3) that comprises a third metal (M3) and a layer of a fourth metal (M4),
wherein the oxygen vacancy reservoir layer is disposed between the second layer of stoichiometric metal oxide (I2) and the third layer of stoichiometric metal oxide (I3), and
wherein a third free formation enthalpy (DG3) of at least a portion of the third layer of stoichiometric metal oxide (I3) by oxidation of the third metal (M3) is greater in absolute value than a second free formation enthalpy (DG2) of at least a portion of the second layer of stoichiometric metal oxide (I2) by oxidation of the second metal (M2).

2. The memory cell according to claim 1, wherein the bottom electrode further comprises a first layer of stoichiometric metal oxide (I1) above the layer of the first metal (M1), the first layer of stoichiometric metal oxide (I1) comprising the first metal (M1).

3. The memory cell according to claim 2, wherein a first free formation enthalpy (DG1) of at least a portion of the first layer of stoichiometric metal oxide (I1) by oxidation of the first metal (M1) is greater than or equal, in absolute value, to the third free formation enthalpy (DG3) of at least a portion of the third layer of stoichiometric metal oxide (I3) by oxidation of the third metal (M3).

4. The memory cell according to claim 3, wherein the layer of the first metal (M1) and the layer of the fourth metal (M4) each comprise at least one metal selected from a non-noble metal other than Pd, Ag, Ir, Pt, and Au.

5. The memory cell according to claim 4, wherein the at least one metal of the layer of the first metal (M1) and of the layer of the fourth metal (M4) is a pure metal, or a binary metal alloy, or a ternary metal alloy, or an alloy with a nitride base or a carbide base or a silicide base or a conductive metal oxide.

6. The memory cell according to claim 1, wherein the layer of the first metal (M1) and the layer of the fourth metal (M4) each comprise at least one metal selected from TiN, TaN, TiAlN, and TaAlN.

7. The memory cell according to claim 1, wherein the bottom electrode and the top electrode are symmetrical in the stack.

8. The memory cell according to claim 2, wherein the first layer of stoichiometric metal oxide (I1) is $TiO_2$, or TiON, or $Al_2O_3$.

9. The memory cell according to claim 1, wherein the second metal (M2) of the second layer of stoichiometric metal oxide (I2) is chosen from among columns III, IV, and V of the periodic table, or is Al, or Si, or a lanthanide.

10. The memory cell according to claim 9, wherein the second layer of stoichiometric metal oxide (I2) is chosen from among $HfO_2$, $ZrO_2$, $TiO_2$, $Al_2O_3$, $Ta_2O_5$, $Nb_2O_5$, $V_2O_5$, $La_2O_4$, $Gd_2O_3$, $Lu_2O_3$, HfSiO, HfZrO, and $SrTiO_3$ (STO).

11. The memory cell according to claim 1, wherein the second layer of stoichiometric metal oxide (I2) has a thickness from 1 nm to 50 nm.

12. The memory cell according to claim 1, wherein the third metal (M3) is a pure metal, or a binary metal alloy, or a ternary metal alloy.

13. The memory cell according to claim 12, wherein the third metal (M3) is chosen from among elements Si, Ti, Zr, Hf, Al, Ta, Nb, V, and from among alloys comprising a mixture of said elements.

14. The memory cell according to claim 1, wherein the stack comprises from bottom to top: $TiN/TiO_2/Ta_2O_5/TaO_x/TiO_2/TiN$.

15. A microelectronic device comprising the resistive non-volatile memory cell according to claim 1.

16. The microelectronic device according to claim 15, further comprising a cavity in which the resistive non-volatile memory cell is at least partially disposed.

17. The microelectronic device according to claim 16, wherein the bottom electrode of the resistive non-volatile memory cell is disposed underneath and outside of the cavity.

18. The microelectronic device according to claim 16, wherein the bottom electrode of the memory cell is disposed in the cavity.

19. The microelectronic device according to claim 15, further comprising a plurality of interconnection levels and a plurality of connection plugs between the levels, each connection plug comprising a cavity in which the resistive non-volatile memory cell is at least partially disposed.

20. A method for manufacturing a resistive non-volatile memory cell according to claim 1, the method comprising the following successive steps:
    forming the bottom electrode by depositing the layer of the first metal (M1);
    depositing the second layer of stoichiometric metal oxide (I2),
    depositing a layer of the third metal (M3);
    forming the layer of substoichiometric metal oxide (I2p) and the third layer of stoichiometric metal oxide (I3) by reacting the third metal (M3) with the second layer of stoichiometric metal oxide (I2); and
    depositing the layer of the fourth metal (M4).

21. The method according to claim 20, wherein the depositing of the layer of the third metal (M3) is performed by flash vapor phase deposition.

22. The method according to claim 20, wherein the layer of the third metal (M3) is deposited to a thickness from 0.1 nm to 2 nm.

23. The method according to claim 20, wherein the second layer of stoichiometric metal oxide (I2) is deposited by chemical deposition.

24. The method according to claim 23, wherein the second layer of stoichiometric metal oxide (I2) is treated with plasma or by plasma nitriding.

25. The method according to claim 24, wherein the second layer of stoichiometric metal oxide (I2) is implanted with aluminum.

26. A method for manufacturing a resistive non-volatile memory cell according to claim 16, the method comprising the following successive steps:
    compliant depositing the second layer of stoichiometric metal oxide (I2) in the cavity;
    depositing a layer of the third metal (M3) in the cavity;
    forming the layer of substoichiometric metal oxide (I2p) and the third layer of stoichiometric metal oxide (I3) by reacting the third metal (M3) with the second layer of stoichiometric metal oxide (I2); and
    depositing the layer of the fourth metal (M4) in the cavity.

27. The method according to claim 26, further comprising, before the depositing of the second layer of stoichiometric metal oxide (I2), forming the bottom electrode by compliant depositing the layer of the first metal (M1) in the cavity.

28. A microelectronic device comprising a resistive non-volatile memory cell and a cavity in which the resistive non-volatile memory cell is at least partially disposed, the resistive non-volatile memory cell comprising a stack, the stack comprising:
    a bottom electrode comprising a layer of a first metal (M1);
    a multilayer insulation disposed on the bottom electrode, the multilayer insulation comprising:
        an oxide layer including a second layer of stoichiometric metal oxide (I2) and being configured to allow a resistive transition, the second layer of stoichiometric metal oxide (I2) comprising a second metal (M2), and an oxygen vacancy reservoir layer including a layer of substoichiometric metal oxide (I2*p*); and a top electrode disposed on the multilayer insulation, the top electrode comprising a third layer of stoichiometric metal oxide (I3) that comprises a third metal (M3) and a layer of a fourth metal (M4), the third layer of stoichiometric metal oxide (I3) being disposed on the bottom of the cavity, wherein the oxygen vacancy reservoir layer is disposed between the second layer of stoichiometric metal oxide (I2) and the third layer of stoichiometric metal oxide (I3), and wherein a third free formation enthalpy (DG3) of at least a portion of the third layer of stoichiometric metal oxide (I3) by oxidation of the third metal (M3) is greater in absolute value than a second free formation enthalpy (DG2) of at least a portion of the second layer of stoichiometric metal oxide (I2) by oxidation of the second metal (M2).

* * * * *